(12) United States Patent
Kim et al.

(10) Patent No.: US 9,590,655 B2
(45) Date of Patent: Mar. 7, 2017

(54) SCALABLE HIGH-BANDWIDTH ARCHITECTURE FOR LOSSLESS COMPRESSION

(71) Applicant: Microsoft Technology Licensing, LLC, Redmond, WA (US)

(72) Inventors: Joo-Young Kim, Kirkland, WA (US); Douglas C. Burger, Bellevue, WA (US); Jeremy Halden Fowers, Seattle, WA (US); Scott A. Hauck, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 4 days.

(21) Appl. No.: 14/738,778

(22) Filed: Jun. 12, 2015

(65) Prior Publication Data
US 2016/0285473 A1   Sep. 29, 2016

Related U.S. Application Data

(60) Provisional application No. 62/139,588, filed on Mar. 27, 2015.

(51) Int. Cl.
H03M 7/00 (2006.01)
H03M 7/30 (2006.01)
H03M 7/40 (2006.01)

(52) U.S. Cl.
CPC .......... H03M 7/3086 (2013.01); H03M 7/40 (2013.01); H03M 7/4006 (2013.01); H03M 7/6011 (2013.01); H03M 7/6023 (2013.01); H03M 7/6029 (2013.01)

(58) Field of Classification Search
CPC .................................................. H03M 7/3084

USPC ................................ 341/51, 50, 106, 65, 67
See application file for complete search history.

(56) References Cited

U.S. PATENT DOCUMENTS

| | | |
|---|---|---|
| 5,203,002 A | 4/1993 | Wetzel |
| 5,371,499 A | 12/1994 | Graybill et al. |
| 5,406,278 A | 4/1995 | Graybill et al. |
| 6,532,012 B2 | 3/2003 | Deering |
| 7,895,151 B2 | 2/2011 | Shau et al. |
| 8,533,166 B1 | 9/2013 | Sulieman et al. |
| 8,635,180 B2 | 1/2014 | Biran et al. |

(Continued)

FOREIGN PATENT DOCUMENTS

EP   2511787 A1   10/2012

OTHER PUBLICATIONS

[MS-XCA]: Xpress Compression Algorithm, Retrieved at <<https://msdn.microsoft.com/en-us/enus/library/hh554002.aspx>> on Mar. 20, 2015, 2 pages.

(Continued)

*Primary Examiner* — Peguy Jean Pierre
(74) *Attorney, Agent, or Firm* — Steve Wight; Sandy Swain; Micky Minhas

(57) ABSTRACT

A method of lossless data compression includes receiving a set of parallel data strings; determining compression hash values for each of the parallel data strings; determining bit matches among portions of each of the parallel data strings based, at least in part, on the compression hash values; selecting among literals and the bit matches for each of the parallel data strings; and applying Huffman encoding to the selected literals or the selected bit matches.

20 Claims, 10 Drawing Sheets

(56) References Cited

U.S. PATENT DOCUMENTS

| | | | |
|---|---|---|---|
| 8,694,703 | B2 | 4/2014 | Hans et al. |
| 8,704,686 | B1 | 4/2014 | Agarwal et al. |
| 8,766,827 | B1 | 7/2014 | Milne et al. |
| 8,806,292 | B2 | 8/2014 | Biran et al. |
| 8,838,544 | B2 | 9/2014 | Biran et al. |
| 9,231,615 | B2 * | 1/2016 | Chen .................. H03M 7/3084 |
| 2007/0286194 | A1 * | 12/2007 | Shavitt .................... H04L 12/56 370/392 |
| 2011/0060876 | A1 * | 3/2011 | Liu ................... G06F 17/30949 711/108 |
| 2013/0318067 | A1 * | 11/2013 | Sukhwani ......... G06F 17/30498 707/714 |
| 2015/0019563 | A1 * | 1/2015 | Wildman ............ G06F 17/3033 707/747 |

OTHER PUBLICATIONS

Abdelfattah et al., "GZIP on a Chip: High Performance Lossless Data Compression on Fpgas Using OpencL," In Proceedings of the International Workshop on OpenCL, published May 12, 2014, 9 pages.

Data Compression, Retrieved at <<http://www.aha.com/data-compression/>> on Mar. 20, 2015, 2 pages.

Deutsch, "ZLIB Compressed Data Format Specification version 3.3," In Proceedings of Request for Comments: 1950, Published May 1996, 10 pages.

Deutsch, "DEFLATE Compressed Data Format Specification Version 1.3," In Proceedings of Request for Comments: 1951, published May 1996, 15 pages.

Deutsch, "GZIP File Format Specification Version 4.3," In Proceedings of Request for Comments: 1952, published May 1996, 12 pages.

Huang et al., "A Reliable LZ Data Compressor on Reconfigurable Coprocessors," In Proceedings of IEEE Symposium on Field-Programmable Custom Computing Machines, published Apr. 17, 2000, 10 pages.

Huffman, "A Method for the Construction of Minimum-Redundancy Codes," In the Proceedings of IRE vol. 40, Issue 9, Published Sep. 1952, 4 pages.

Hwang et al., "Unified VISI Systolic Array Design for LZ Data Compression," In Proceedings of IEEE Transactions on Very Large Scale Integration (VLSI) Systems, vol. 9, Issue 4, published Aug. 2001, 11 pages.

Jin et al., "Pipelined Hardware Architecture for High-Speed Optical Flow Estimation Using FPGA," In Proceedings of 18th IEEE Annual International Symposium on Field-Programmable Custom Computing Machines, Published May 2, 2010, 4 pages.

Kim et al., "A Scalable Multiengine Xpress9 Compressor with Asynchronous Data Transfer," In Proceedings of IEEE 22nd Annual International Symposium on Field-Programmable Custom Computing Machines, published May 11, 2014, 4 pages.

Laforest et al., "Efficient Multi-Ported Memories for FPGAs," In Proceedings of Eighteenth ACM/SIGDA International Symposium on Field-Programmable Gate Arrays, published Feb. 21, 2010, 10 pages.

LZMA SDK (Software Development Kit), Retrieved at <<http://www.7-zip.org/sdk.html>> on Mar. 20, 2015, 2 pages.

Mahoney, "Large Text Compression Benchmark," Retrieved at <<http://mattmahoney.net/dc/text.html>> on Mar. 20, 2015, 87 pges.

Malazgirt et al., "Application Specific Multi-Port Memory Customization in FPGAs," In Proceedings of 24th International Conference on Field Programmable Logic and Applications, Published Sep. 2, 2014, 4 pages.

Putnam et al., "A Reconfigurable Fabric for Accelerating Large-Scale Datacenter Services," In Proceedings of ACM/IEEE 41st International Symposium on Computer Architecture, published Jun. 14, 2014, 12 pages.

Rigler et al., FPGA-Based Lossless Data Compression Using Huffman and Lz77 Algorithms, In Proceedings of Canadian Conference on Electrical and Computer Engineering, published Apr. 22, 2007, 4 pages.

Silesia Compression Corpus, Retrieved at <<http://sun.aei.polsl.pl/~sdeor/index.php?page=silesia>> on Mar. 20, 2015, 2 pages.

Sukhwani et al., "Highthroughput, Lossless Data Compression on FPGAS," In Proceedings of IEEE 19th Annual International Symposium on Field-Programmable Custom Computing Machines, Published May 1, 2011, 4 pages.

The Canterbury Corpus, Retrieved at <<http://corpus.canterbury.ac.nz/descriptions/>> on Mar. 20, 2015, 2 pages.

Ziv et al., "A Universal Algorithm for Sequential Data Compression," In Proceedings of the IEEE Transactions on Information Theory, vol. 23, Issue 3, Published May 1977, 7 pages.

Martin et al., "FPGA-Based Application Acceleration: Case Study with GZIP Compression/Decompression Streaming Engine," in Special Session 7C, International Conference on Computer-Aided Design, ICCAD, Nov. 18-21, 2013, 46 pages.

Fowers, "A Scalable High-Bandwidth Architecture for Lossless Compression on FPGAs", in the Proceedings of the 2015 IEEE 23rd International Symposium on Field-Programmable Custom Computing Machines, May 2015, 8 pages.

IEEE/The Open Group, "The Open Group Base Specifications", 2004 Edition, Issue 6, available at: <<http://pubs.opengroup.org/onlinepubs/009695399/functions/strcmp.htm>>, 3 pages.

Klein et al., "Parallel Lempel Ziv Coding (Extended Abstract)", in the Proceedings of the Combinatorial Pattern Matching: 12th Annual Symposium, vol. 2089, Jul. 2001, 22 pages.

PCT Search Report and Written Opinion mailed Jun. 20, 2016 for PCT Application No. PCT/US16/022526, 13 Pages.

Wikipedia, "Hash table", retrieved on Jun. 3, 2016, available at: <<https://en.wikipedia.org/w/index.php?title=Hash_table&oldid=653140916>>, 20 pages.

* cited by examiner

SCALABLE HIGH-BANDWIDTH ARCHITECTURE FOR LOSSLESS COMPRESSION

PRIORITY APPLICATION

This application claims priority to U.S. Provisional Patent Application No. 62/139,588 filed Mar. 27, 2015, the entire contents of which are incorporated herein by reference.

BACKGROUND

As the speed and size of networked computer systems continue to increase, so does the amount of data stored within, and exchanged among, such systems. Though effort has been focused on developing larger and denser storage devices as well as faster networking technologies, continually increasing demand for storage space and networking bandwidth has led to the development of technologies that further optimize storage space and bandwidth currently available on existing storage devices and networks. One such technology is data compression, where data saved to a storage device or transmitted across a network, for example, is modified to reduce the number of bytes required to represent the data. Accordingly, data compression may reduce the storage and bandwidth required to store and/or transmit the data.

Data compression can be divided into two general categories: lossy data compression and lossless data compression. As the terms imply, lossy data compression allows for some loss of fidelity in the compressed (e.g., encoded) information, while lossless data compression provides that the decompressed data be an exact copy of the original data, with no alterations or errors. While lossy data compression may be suitable for applications that process audio, image and/or video data, a great many other data processing applications benefit from the fidelity provided by lossless data compression.

Lossless compression techniques may use DEFLATE, which is a combination of Lempel-Ziv compression and Huffman encoding. Lempel-Ziv compression (LZ77) performs compression by matching a current input data sequence with a reference to a copy of that data sequence existing earlier in the input data stream. If a match is found, the match is encoded by a length-distance (L, D) pair. The length-distance pair indicates the equivalent of the statement "go back D characters from the current input data location, and copy L characters from that location." To spot matches, an LZ77 encoder keeps track of the most recent data in the input data stream. The data structure in which this data is held is called a window, which is a sliding window that updates with time. The LZ77 encoder maintains this data to look for matches, and a corresponding LZ77 decoder maintains this data to interpret the matches to which the LZ77 encoder refers.

Huffman encoding is an entropy encoding process used for lossless data compression. Huffman encoding may use a variable-length code table for encoding a source symbol where the variable-length code table has been derived in a particular way based on an estimated or measured probability of occurrence for each possible value of the source symbol. Huffman encoding may create an un-prefixed tree of non-overlapping intervals, where the length of each sequence is inversely proportional to the probability of that symbol needing to be encoded. Accordingly, the more likely a symbol has to be encoded, the shorter its bit-sequence will be.

Thus, the first, LZ77 stage of compression looks for duplicate series of bytes (e.g. a replicated string), and replaces these with a back-reference (e.g., pointer) linking to the previous location of that identical string. A second, Huffman Encoding compression stage includes replacing commonly used symbols with shorter representations and less commonly used symbols with longer representations.

SUMMARY

This disclosure describes, in part, techniques and architectures for a scalable high-bandwidth compression accelerator that may be implemented on reconfigurable or fixed devices. Various examples include a partially or fully pipelined hardware-implementable compression process. For example, such a fully pipelined process may be performed by hardware, such as Field-Programmable Gate Arrays (FPGAs), among other possibilities. The compression process may involve, among other things, a hash table organized for parallel hash reads and updates, parallel string matchings with multi-port wide and bit-width memories, and a bit-packing network for converting selected matches into final bits.

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter. The term "techniques," for instance, may refer to system(s), method(s), computer-readable instructions, module(s), algorithms, hardware logic (e.g., FPGAs, application-specific integrated circuits (ASICs), application-specific standard products (ASSPs), system-on-a-chip systems (SOCs), complex programmable logic devices (CPLDs)), and/or other technique(s) as permitted by the context above and throughout the document.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Figure 1:
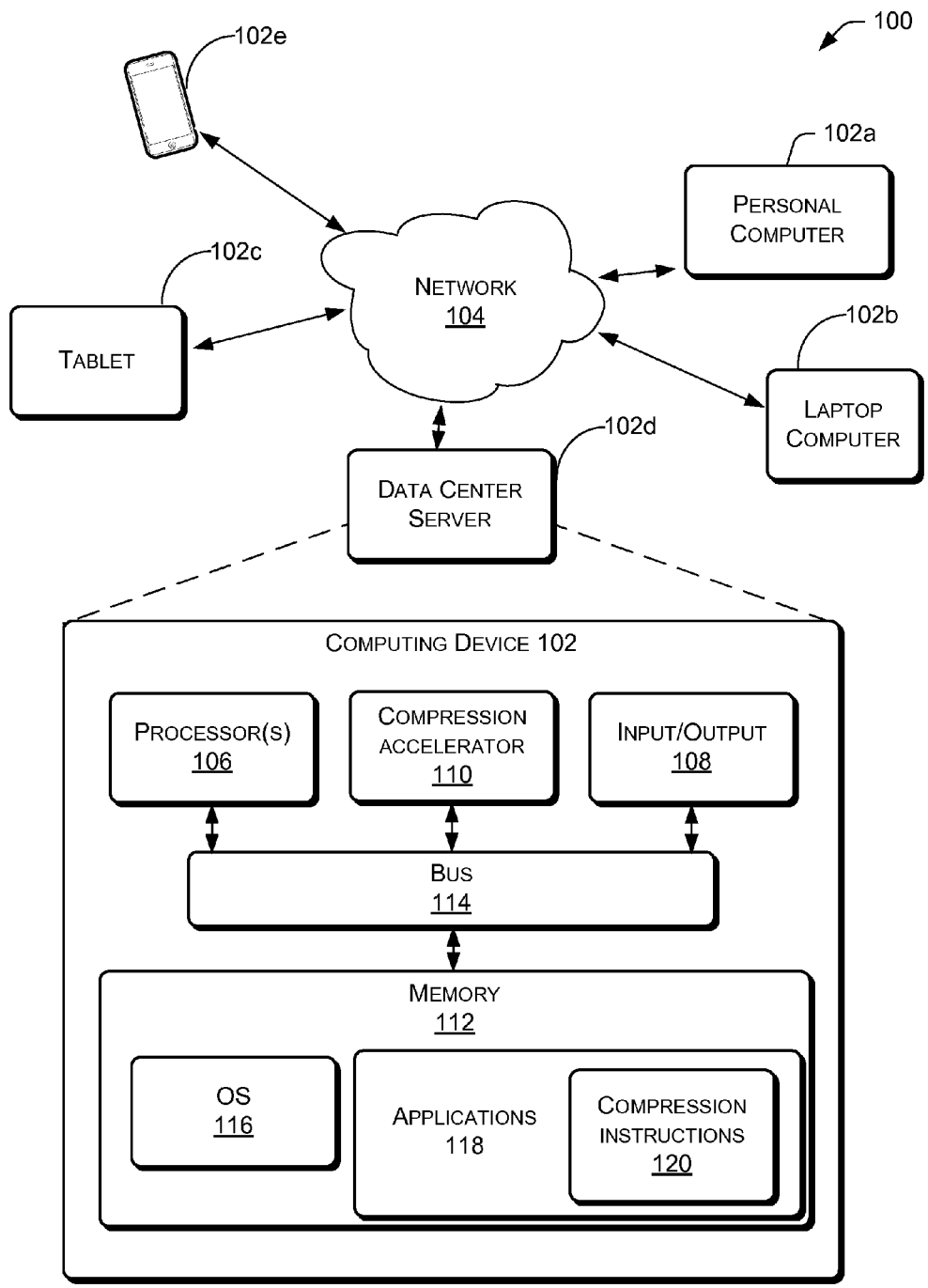
FIGS. 1-3 are block diagrams depicting example environments in which techniques described herein may be implemented.

In various examples, techniques and architectures may be used for high-throughput lossless data compression. Particular examples include a scalable high-bandwidth compression accelerator that may be implemented on reconfigurable devices, such as Field-Programmable Gate Arrays (FPGAs), on program-specific integrated circuits (ASICs), or in a multi-processor or multi-core processor environment. In some implementations, lossless compression may be performed using a fully pipelined hardware-amenable compression process. In such a process, various data compression processes may be performed simultaneously in a parallel fashion. This provides a number of benefits including, but not limited to, relatively high data compression throughput that may be scaled to network traffic rates (e.g., in a data center).

Some examples described herein involve various lossless compression techniques, such as a modified DEFLATE compression process. DEFLATE is a lossless data compression process that uses a combination of the LZ77 process and Huffman encoding. LZ77 processes achieve compression by replacing repeated occurrences of data with references to a previous copy of that data existing earlier in the input (uncompressed) data stream. A match is encoded by a pair of numbers called a length-distance pair.

In various examples, a modified DEFLATE process enables data-parallelism and pipeline-parallelism while limiting the sacrifices to compression quality, where compression quality refers to an amount of compression (by definition, lossless compression does not result in loss of any of the underlying data). In contrast, the unmodified DEFLATE compression process includes data-hazards and other features that make it challenging to implement in scalable hardware. The modified DEFLATE process may include parallel execution and hardware pipelining. Such modifications may be particularly well-suited for hardware mapping, for example.

In general, a DEFLATE process may use a chained hash table implemented with head and prev hash tables to find duplicated data strings from earlier in a sequence of data. The following process includes example pseudocode for a hash update process for conventional DEFLATE.

Process 1: DEFLATE Process.
1: while (current position<data size) do
2: Hash chain build
calculate hash index hi
Prev[pos]←Head[hi]
Head[hi]←pos
String matching
candidates from a hash chain vs. current
Match selection
For either literal or match committed
   Huffman encoding
   Move to next position
3: end while Herein, a hash index, being the result of hash function, may be used to address a hash table. A hash value is the value in the hash table addressed by a hash index (e.g., hash value=hash_table [hash_index]).

As illustrated in Process 1, for a current byte of data of an input data sequence, process 1 calculates a hash index by applying a hash function on a consecutive multi-byte data sequence that includes the current byte of data. A head table of a chained hash table caches the most recent position for each hash index, while a prev table of the chained hash table stores linked lists of matching positions for corresponding hash indexes. Each linked list starts with the second-most recent matching position for the corresponding hash index. As a result, Process 1 may traverse through the prev table for previous matching positions having the same hash index. Such matching positions may be considered to be candidate positions. A string matching process may include examining the input data sequence with respect to strings from the candidate positions to find the longest match. To improve compression for the input data sequence, Process 1 need not commit the matches (e.g., corresponding to the candidate positions) immediately, but instead may search for another matching data sequence at the subsequent position. If a longer match is found, Process 1 may truncate the previous match to a literal and repeat the search for another matching data sequence at subsequent positions (e.g., performing a lazy evaluation) until Process 1 encounters a worse match. Otherwise, Process 1 may emit the previous match and skip forward by the length of the match. Such a process may be repeated until Process 1 covers the entire input data sequence.

Some embodiments of the present disclosure parallelize the above process by modifying it to a parallelization window process. Such a process may act on multiple consecutive positions of an input data sequence at the same time in a multi-threaded fashion. Such a set of multiple consecutive positions is called a parallelization window. The input data sequence may include multiple parallelization windows. The size of a parallelization window (e.g., the number of positions computed on in parallel) is called the parallelization window size (PWS). Each position in the window may execute hash chain build and string matching processes independently of one another. Among the positions of the input data sequence, dependencies may exist in a hash table update stage that performs write operations on head and prev tables. In some implementations, such dependencies may be solved using the chaining property of head and prev updates. In other implementations, such dependencies may be solved by redesigning the hash table structure, as discussed below. A subsequent string matching process may be executed in parallel, although the process may invoke relatively many concurrent read operations to data memory.

Another dependency issue in the parallelization window process may occur between neighboring windows of an input data sequence. Match selection results from one window may impact a match selection process for the following window, resulting in a data hazard for window pipelining. To resolve such a problem, matches may be truncated so that the matches match data within their respective local window. Doing this may ensure that the starting position of the next window will be off by PWS (e.g., the number of the parallelization window size) from the current window. Such a match truncation strategy may contribute to compression loss, because the maximum possible length of a match is limited by PWS. Accordingly, in some embodiments, a lazy match selection evaluation may be performed to recoup some of the lost compression, as described below.

To correspond to the parallelization window process introduced above, construction and configuration of a DEFLATE hash table is modified to improve its amenability for hardware implementation. For example, the head-prev linked list design is changed to a multiple hash table design. In this design, the first hash table includes the latest positions for hash indexes, while the second hash table has the second latest positions, the third hash table includes the third latest positions, and so on. Such a multiple hash table design may have the benefit of retrieving previous match positions simultaneously and need not traverse a prev table. The number of hash tables in the multiple hash table design is a parameter called hash table depth (HTD). The number of hash chain walks allowed in the unmodified DEFLATE process may be equivalent to HTD, for example. The following process includes example pseudocode for a hash update process for the parallelization window process of some embodiments of the present disclosure.

Process 2 Hash update process.
for i=HTD−1 to 0 do
Candidate[i]←HashTable[i][hi]
if i≥1 then
   HashTable[i][hi]←HashTable[i−1][hi]
else
   HashTable[i][hi]←pos
end if
end for Various examples are described further with reference to FIGS. 1-10.

The environment described below constitutes but one example and is not intended to limit the claims to any one particular operating environment. Other environments may be used without departing from the spirit and scope of the claimed subject matter.

FIG. 1 illustrates an example environment 100 in which example processes involving lossless compression as described herein can operate. In some examples, the various devices and/or components of environment 100 include a variety of computing devices 102. By way of example and not limitation, computing devices 102 may include devices 102a-102e. Although illustrated as a diverse variety of device types, computing devices 102 can be other device types and are not limited to the illustrated device types. In some implementations any of a number of computing devices 102 may be interconnected via a network 104. Such a network may include one or more data centers that store and/or process information (e.g., data) received from and/or transmitted to computing devices 102.

Computing devices 102 can comprise any type of device with one or multiple processors 106 operably connected to an input/output interface 108, a compression accelerator 110, and memory 112, e.g., via a bus 114. Computing devices 102 can include personal computers such as, for example, desktop computers 102a, laptop computers 102b, tablet computers 102c, data center servers 102d (or servers is any other environment), telecommunication devices 102e, electronic book readers, wearable computers, automotive computers, gaming devices, etc. Computing devices 102 can also include other computing devices such as, for example, server computers, thin clients, terminals, and/or work stations. In some examples, computing devices 102 can include, for example, components for integration in a computing device, appliances, or other sorts of devices.

In some examples, some or all of the functionality described as being performed by computing devices 102 may be implemented by one or more remote peer computing devices, a remote server or servers, or a cloud computing resource. In some examples, a computing device 102 may comprise an input port to receive an input data sequence. Computing device 102 may further comprise one or multiple processors 106 to perform a hardware amendable compression process, for example. In some implementations, one or multiple processors 106 may be configured to determine compression hash values for a number of parallel data strings, determine bit matches among portions of each of the parallel data strings based, at least in part, on the compression hash values, select among literals and the bit matches for each of the parallel data strings, and apply Huffman encoding to the selected literals or the selected bit matches.

In some examples, as shown regarding device 102d, memory 112 can store instructions executable by the processor(s) 106 including an operating system (OS) 116, and programs or applications 118 that are loadable and executable by processor(s) 106. Applications 118 may include compression instructions 120 that may be executed to operate compression accelerator 110, for example. The one or more processors 106 may include one or more central processing units (CPUs), graphics processing units (GPUs), video buffer processors, and so on. In some implementations, compression instructions 120 comprise executable code stored in memory 112 and are executable by processor(s) 106 to receive and compress data sequences (e.g., streaming data or data files), locally or remotely by computing device 102, via input/output 108. In some examples, the data sequences may be associated with one or more of applications 118. Compression instructions 118 may operate in combination with compression accelerator 110 to apply any of a number of processes used to losslessly compress data stored in memory 112 or received via input/output 108.

Though certain blocks have been described as performing various operations, the modules are merely examples and the same or similar functionality may be performed by a greater or lesser number of modules. Moreover, the functions performed by the modules depicted need not necessarily be performed locally by a single device. Rather, some operations could be performed by a remote device (e.g., peer, server, cloud, etc.).

Alternatively, or in addition, some or all of the functionality described herein can be performed, at least in part, by one or more hardware logic components. For example, and without limitation, illustrative types of hardware logic components that can be used include FPGAs, program-specific integrated circuits (ASICs), program-specific standard products (ASSPs), system-on-a-chip devices (SOCs), complex programmable logic devices (CPLDs), etc. For example, all or a portion of compression accelerator 110 may be implemented on or by FPGAs, ASICs, ASSPs, SOCs, and/or CPLDs.

In some examples, computing device 102 can be associated with a camera capable of capturing images and/or video and/or a microphone capable of capturing audio. For example, input/output module 108 can incorporate such a camera and/or microphone. Audio or images, for example, may be converted to sequences of data and losslessly compressed by processes performed, at least in part, by compression accelerator 110. Memory 112 may include one or a combination of computer readable media.

Computer readable media may include computer storage media and/or communication media. Computer storage media includes volatile and non-volatile, removable and non-removable media implemented in any method or technology for storage of information such as computer readable instructions, data structures, program modules, or other data. Computer storage media includes, but is not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device.

In contrast, communication media embodies computer readable instructions, data structures, program modules, or other data in a modulated data signal, such as a carrier wave, or other transmission mechanism. As defined herein, computer storage media does not include communication media. In various examples, memory 112 is an example of computer storage media storing computer-executable instructions.

In various examples, an input device of input/output (I/O) interfaces 108 can be a direct-touch input device (e.g., a touch screen), an indirect-touch device (e.g., a touch pad), an indirect input device (e.g., a mouse, keyboard, a camera or camera array, etc.), or another type of non-tactile device, such as an audio input device.

Computing device(s) 102 may also include one or more input/output (I/O) interfaces 108 to allow the computing device 102 to communicate with other devices. Input/output (I/O) interfaces 108 can include one or more network interfaces to enable communications between computing device 102 and other networked devices such as other device(s) 102. Input/output (I/O) interfaces 108 can allow a device 102 to communicate with other devices such as user input peripheral devices (e.g., a keyboard, a mouse, a pen, a game controller, a voice input device, a touch input device, gestural input device, and the like) and/or output peripheral devices (e.g., a display, a printer, audio speakers, a haptic output, and the like).

Figure 2:
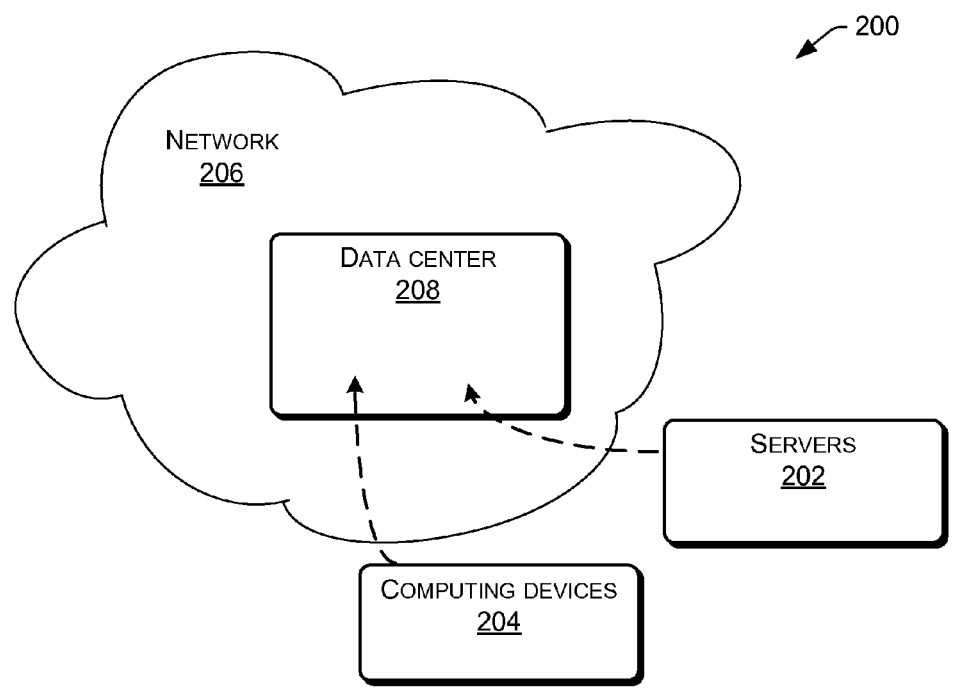

FIG. 2 is a block diagram depicting an example system 200 that includes any number of servers 202 and computing devices 204 in communication with a network 206. At least a portion of servers 202 and/or computing devices 204 are located in at least one data center 208, as indicated by the dashed arrows. Such communication, for example, may involve transmitting and/or receiving data among servers 202, computing devices 204, and data center 208 via network 206 at relatively fast network rates. For example, data received in data center 208 may comprise network data traffic via the Internet (e.g., network 206), for example. Such data may be received by the data center at network speeds that exceed 10 Gb/sec, for example.

Individual servers 202 and computing devices 204, for example, may be the same as or similar to computing device 102 described above and illustrated in FIG. 1. Network 206 may the same as or similar to network 104, for example, described in FIG. 1. In some examples, data center 208 is a facility used to house computer systems and associated components, such as telecommunications and storage systems. Such a data center may include, among other things, redundant or backup power supplies, redundant data communications connections, environmental controls (e.g., air conditioning, fire suppression), and various security devices. Data centers may involve industrial-scale operations and relatively large amount of electrical power for supporting operations.

Figure 3:
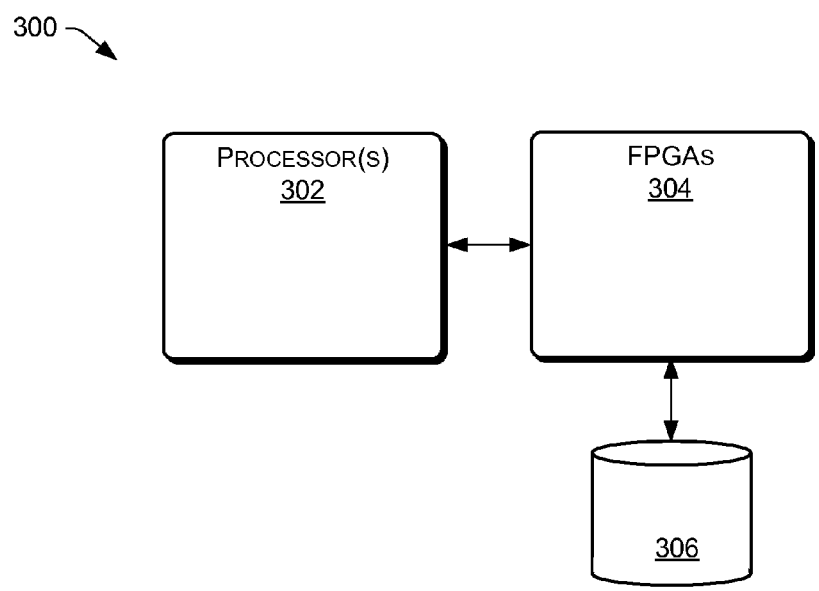

FIG. 3 is a block diagram depicting an example system 300 that includes any number of processors 302 and FPGAs 304. System 300, which may be incorporated in a data center (e.g., 208) for example, may be similar to or the same as computing device 102 described above for FIG. 1. System 300 may be configured to losslessly compress data that is received into the data center or transmitted from the data center. In some implementations, such data may be transmitted through FPGAs 304, for example. FPGAs 304 may directly communicate with memory 306, which may store data during pipeline compression processes performed with FPGAs 304.

In some examples, FPGAs 304 may be the same as or similar to compression accelerator 110 illustrated in FIG. 1. In various implementations, system 300 may include any number of ASICs, ASSPs, SOCs, CPLDs, or a combination thereof, in addition to, or in place of, FPGAs 306. In other words, for example, pipeline compression described herein may be implemented using any of a number of hardware configurations, such as those listed above.

Figure 4:
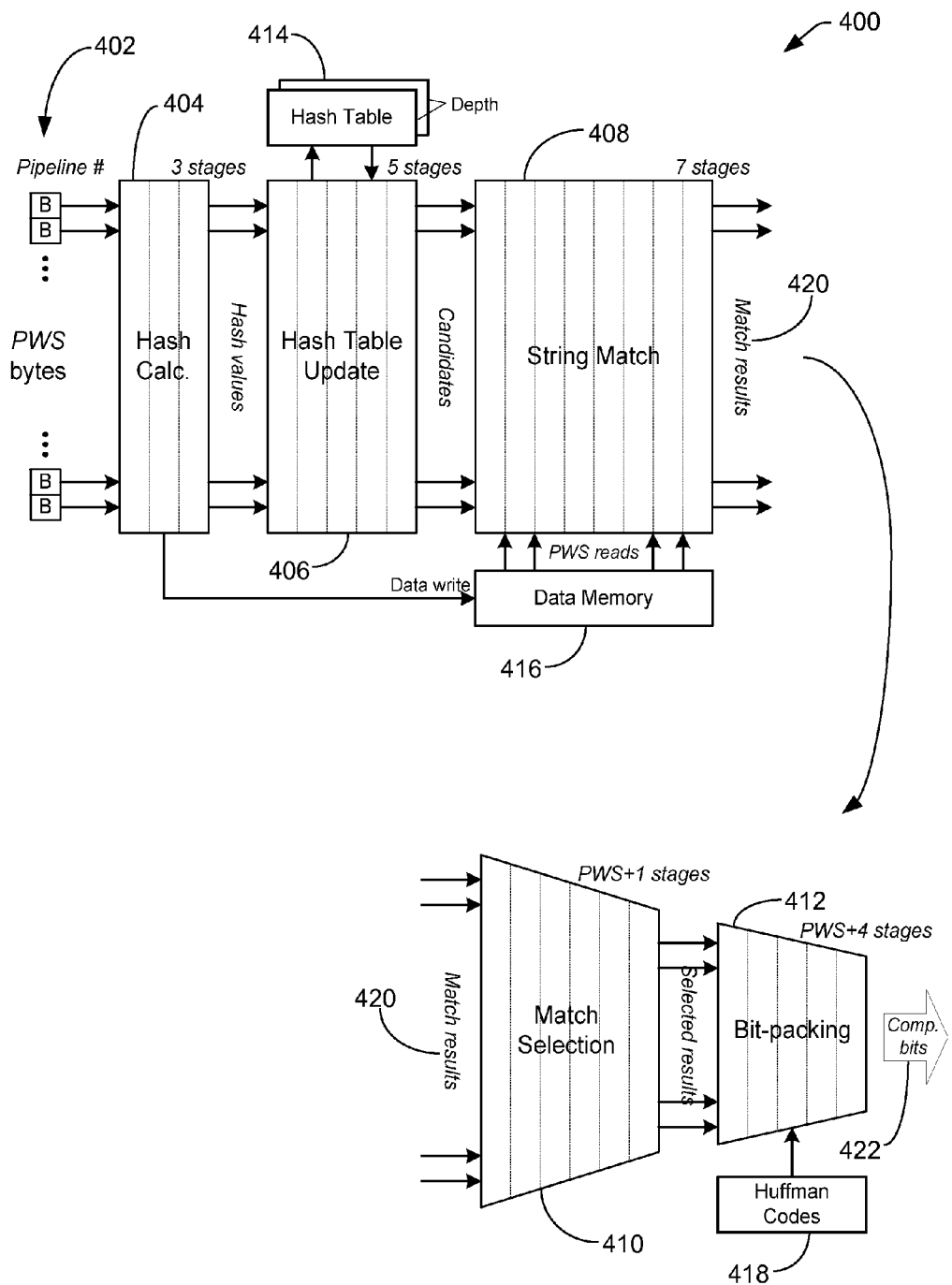
FIG. 4 is a block diagram of an example pipeline system for data compression.

FIG. 4 is a block diagram of an example pipeline system 400 for data compression. System 400 may comprise any combination of executable code and hardware. For example, computing device 102 (e.g., FIG. 1) may include system 400. In another example, system 400 may be incorporated in data center 208, servers 202, and/or computing devices 204 in system 200 (e.g., FIG. 2). In still another example, system 400 may be the same as or similar to system 300, illustrated in FIG. 3.

System 400 may perform a parallelization window process, such as that described above by process 2, for example. System 400 may act on multiple consecutive positions (e.g., a parallelization window) of an input data sequence at the same time in a multi-threaded fashion. As described above, an input data sequence may include multiple parallelization windows, each having a size PWS. Each position in the window may execute hash chain build and string matching processes independently of one another.

System 400 comprises a pipelined architecture of a lossless compressor having a number of individual stages, described below. In a particular example, system 400 may have (20+2*PWS) stages. System 400 may receive PWS bytes of data 402 from an input source every cycle and directs them into the pipeline. Such an input source may be the same as or similar to input/output 108, illustrated in FIG. 1, for example. In some implementations, the pipelined architecture of system 400 may not allow stalling in the pipeline. Accordingly, input bytes of data 402 may be converted to compressed bits in a fixed latency. Because of such a no-stall pipeline architecture, input data rates for system 400 may be readily calculated. For example, the input data rate may be (PWS×clock rate) bytes per second.

System 400 comprises a number of functional components. For example, system 400 includes a hash calculation module 404, a hash table update module 406, string match module 408, match selection module 410, and bit-packing module 412. Individually, hash table update module 406 may include multi-bank hash tables 414, string match module 408 may access data memory 416, and bit-packing module 412 may receive Huffman codes from block 418, for example.

In some particular implementations, hash calculation module 404 includes three stages, hash table update module 406 includes five stages, string match module 408 includes seven stages, match selection module 410 includes (PWS+1) stages, and bit-packing module 412 include (PWS+4) stages.

To sustain high data throughput while compressing multiple bytes to compressed bits, modules in system 400 may perform a number of particular processes. For example, hash calculation module 404 may convert the PWS bytes into hash indexes ranging from 0 to (64K−1) for a hash table update, while hash calculation module 404 stores the bytes to data memory 416 for a further matching stage. As explained below, hash table update module 406 may receive match candidates for PWS hash indexes from multi-bank hash table 414, while resolving bank conflicts among inputs. Simultaneously, the multi-banked hash table may be updated with new positions.

In some examples, at each match candidate position in an input data string, match module 408 may perform PWS independent matchings between the current string and previous strings. Such a relatively large matching computation may require PWS reads of PWS bytes from data memory 416 (e.g., which may have a size of 64 KB).

In some examples, match selection module 410 may receive PWS candidate matches 420 per cycle, which may be too many candidate matches to process in a single stage. Thus, match selection module 410 may perform greedy or lazy evaluation to select among the candidate matches. As described below, data hazards may exist because each candidate match may preclude other candidate matches within a certain range of positions.

In some examples, described below, bit-packing module 412 may create a PWS-aligned byte stream out of many Huffman-encoded selection results. A large amount of buffering and bit shifting may be required to align the data. Bit-packing module 412 produces at its output compressed bits 422.

Figure 5:
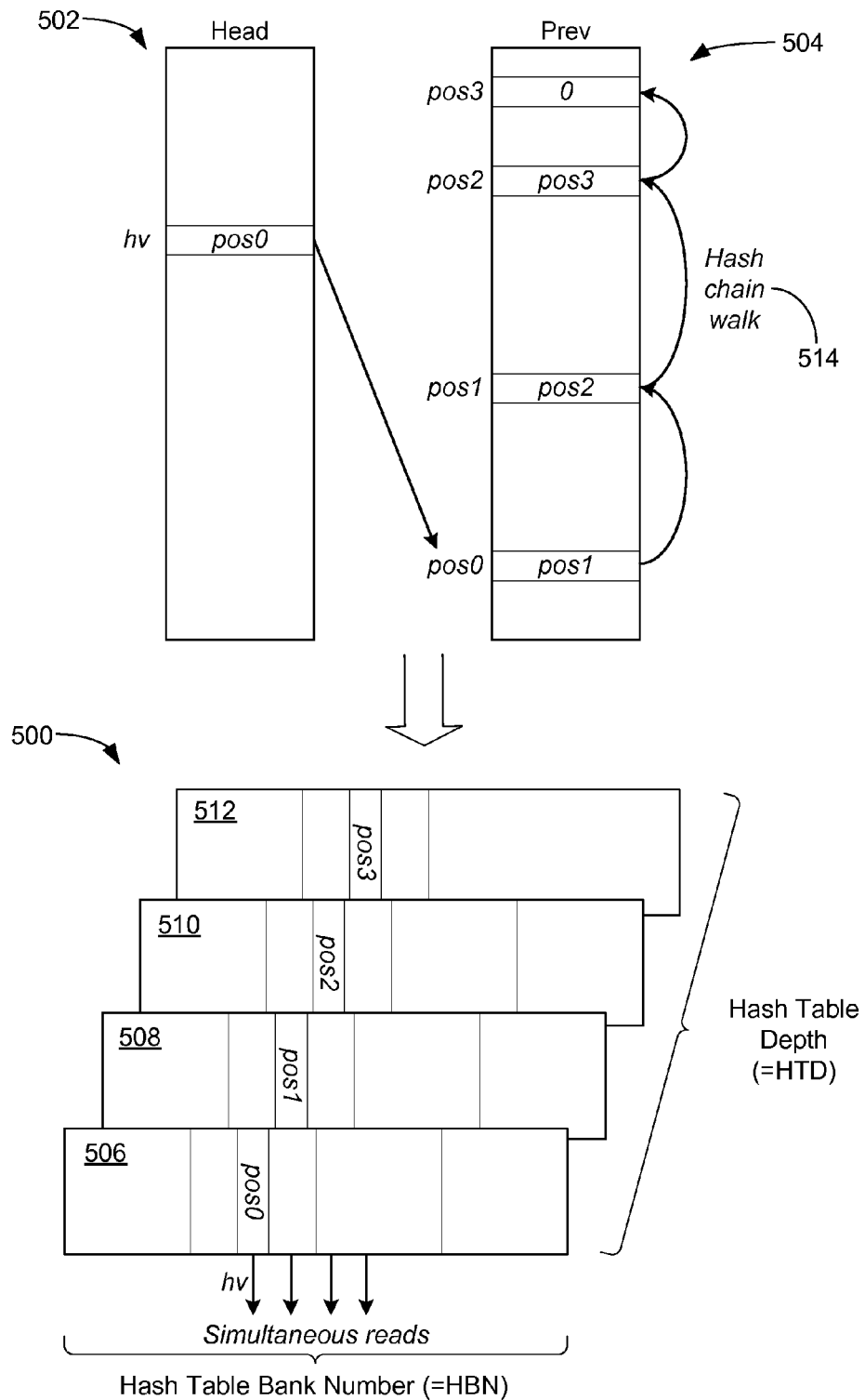
FIG. 5 is a schematic diagram of an example hash table configuration for data compression.

FIG. 5 is a schematic diagram of an example hash table configuration 500 for data compression. Such a configuration, which may be the same as or similar to multi-bank hash table 414, for example, may be readily amenable for a scalable hardware platform. As indicated in FIG. 5, head hash table 502 and prev hash table 504, previously associated with one another by a linked list configuration, is configured to multiple hash table configuration 500. In various examples, the first hash table 506 includes the latest positions for hash indexes, the second hash table 508 has the second latest positions for hash indexes, the third hash table 510 includes the third latest positions for hash indexes, and the fourth hash table 512 includes the fourth latest positions for hash indexes. Hash table configuration 500 has a benefit of being able to retrieve previous positions for hash indexes simultaneously with no need to traverse a prev hash table (e.g., 504). The number of hash tables in multiple hash table configuration 500 is called hash table depth (HTD). For sake of comparison, HTD, in some examples, may be equivalent to the number of hash chain walks 514 allowed in a DEFLATE process (e.g., Process 1, described above). A hash update process for multiple hash table configuration 500 may be similar to or the same as Process 2, described above.

Multiple hash table configuration 500 allows candidate positions with the same hash index to access all hash tables at the same time. Hash tables 506-512 (other implementations may include more or fewer hash tables) may be updated in a shifted fashion that discards the oldest position and uses the current position as the latest position. However, such a hash read and update process may present a hardware realization problem if the process is applied to multiple positions simultaneously. Each position may involve a single read and a single write process for each of the hash tables 506-512. Accordingly, parallelization of multiple hash table configuration 500 may involve PWS read and PWS write operations in a single cycle for each hash table of the configuration.

Multi-port memory designs are generally expensive (e.g., have a relatively high cost and logic footprint) on FPGA devices. Memory supporting simultaneous N read and M write operations involves roughly N*M replicas of physical memory blocks and additional synchronization logic resources, for example. Such demands for memory may render a pipeline system for data compression (e.g., 400) impractical for scaling to larger PWS values necessary for both better compression and higher throughput. To resolve this problem, a multi-banking solution may be implemented. Such a multi-banking solution need not require any replicas for multi-port operation, while increasing read/write throughput by a factor up to the number of banks, depending on how bank conflicts occur. The number of banks corresponding to multiple hash table configuration 500 is the hash table bank number (HBN). Each bank may perform hashing for positions whose hash modulo HBN falls into the index of the bank.

Multiple hash table configuration 500 may encounter bank conflicts if two or more hash indexes have the same modulo result. To achieve both a seamless hardware pipeline and a single read and a single write requirement per bank, all conflicted inputs in the hash table may be dropped after a second request from the smallest position. Such a dropping strategy may also solve a dependency problem mentioned above. Some possible candidate positions may be missed due to the dropping, and thus there may be a loss in compression. Bank conflicts may be mitigated by choosing a large enough HBN value since the hash function may typically generate well-spread hash indexes. For example, HBN may be 64, which is a value that may yield reasonable trade-offs between conflict reduction effect and hardware cost for multi-banking In some embodiments, the dropping strategy described above may be performed after N requests (N being an integer one or greater), and not limited to each bank having up to two requests out of PWS inputs, as in the description above. For example, in some embodiments, each bank may have up to three requests (involving more resources) or the strategy may involve spending multiple cycles to have more requests (with a possible throughput performance cost). In general, there are resource intensive ways to improve data compression throughput. For example, a process may replicate data across multiple memories to have [(number of operations per cycle)=(2*number of copies)]. In the case where memory is to be written to, the process may employ a coherency scheme (even more resources).

Figure 6:
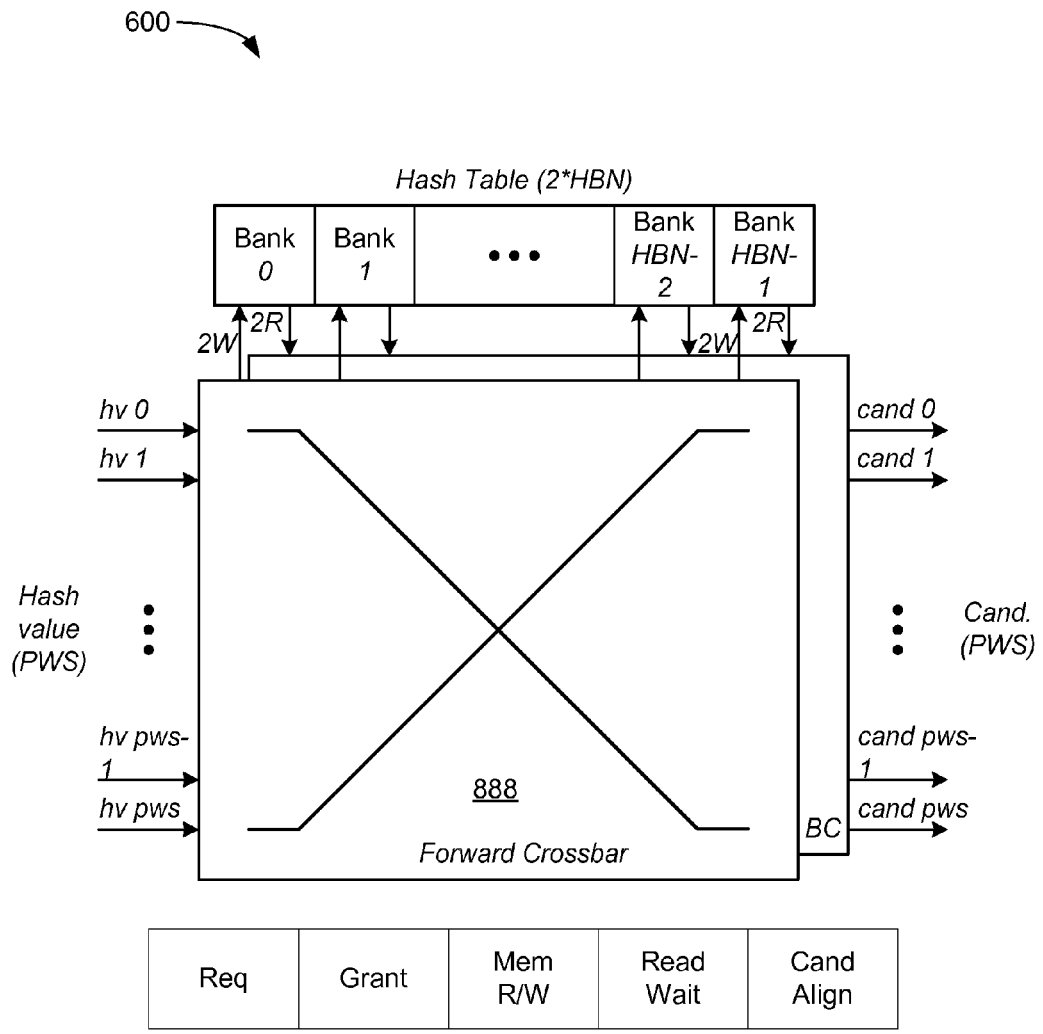
FIG. 6 is a block diagram of an example pipelined hash table read and update module for data compression.

FIG. 6 is a block diagram of an example pipelined hash table read and update module 600 for data compression. Module 600 may be implemented in hash table update module 406. As explained above, multiple read/writes in a multiple hash table configuration (e.g., 500) may be resolved by using a multi-banking scheme that drops banking conflicts.

Module 600 may comprise a five-stage pipelined hash table read and update module with two fully connected crossbar switches. Pipelined hash table read and update module 600 may receive PWS input hash indexes per cycle from hash calculation module 404 (FIG. 4). Based on least significant bit (LSB) values of the input hash indexes, module 600 may route each input hash index (e.g., match position) to a corresponding one of HBN banks Thus, input hash indexes may be placed into a series of banks 0, 1, 2 . . . (HBN−1). Requests for multiple input positions may be sent to a single bank and an arbiter may select up to two requests per cycle.

In some implementations, each bank in the multiple hash table configuration may operate with a clock rate that is double that of the clock rate for other portions of system 400. Accordingly, each bank in the multiple hash table configuration may handle up to two hash updates involving two read and two write operations per cycle. Because each input hash index may update any channel of any bank in the multiple hash table configuration, the fully connected crossbar switch in module 600 may have an input port size of PWS and an output port size of 2*HBN. After getting a grant from the arbiter of the banks, each input position may access the granted bank to read a candidate position value and update it to the current position. For the sake of comparison, for a single depth hash table, read and write operations may be performed during the same cycle by configuring a memory output mode to read old data. In contrast, in the case of a multi-depth hash table (e.g., 500), the hash update process waits for read data to arrive while resolving possible dependencies by forwarding without stalling. Read candidate positions may arrive in two cycles from the banks and the read candidate positions may be re-aligned to match correct input positions. Therefore, another full crossbar switch may be used to connect 2*HBN bank ports to PWS output ports. As a result, pipelined hash table read and update module 600 may provide PWS candidate positions per cycle to string matching module 408.

Figure 7:
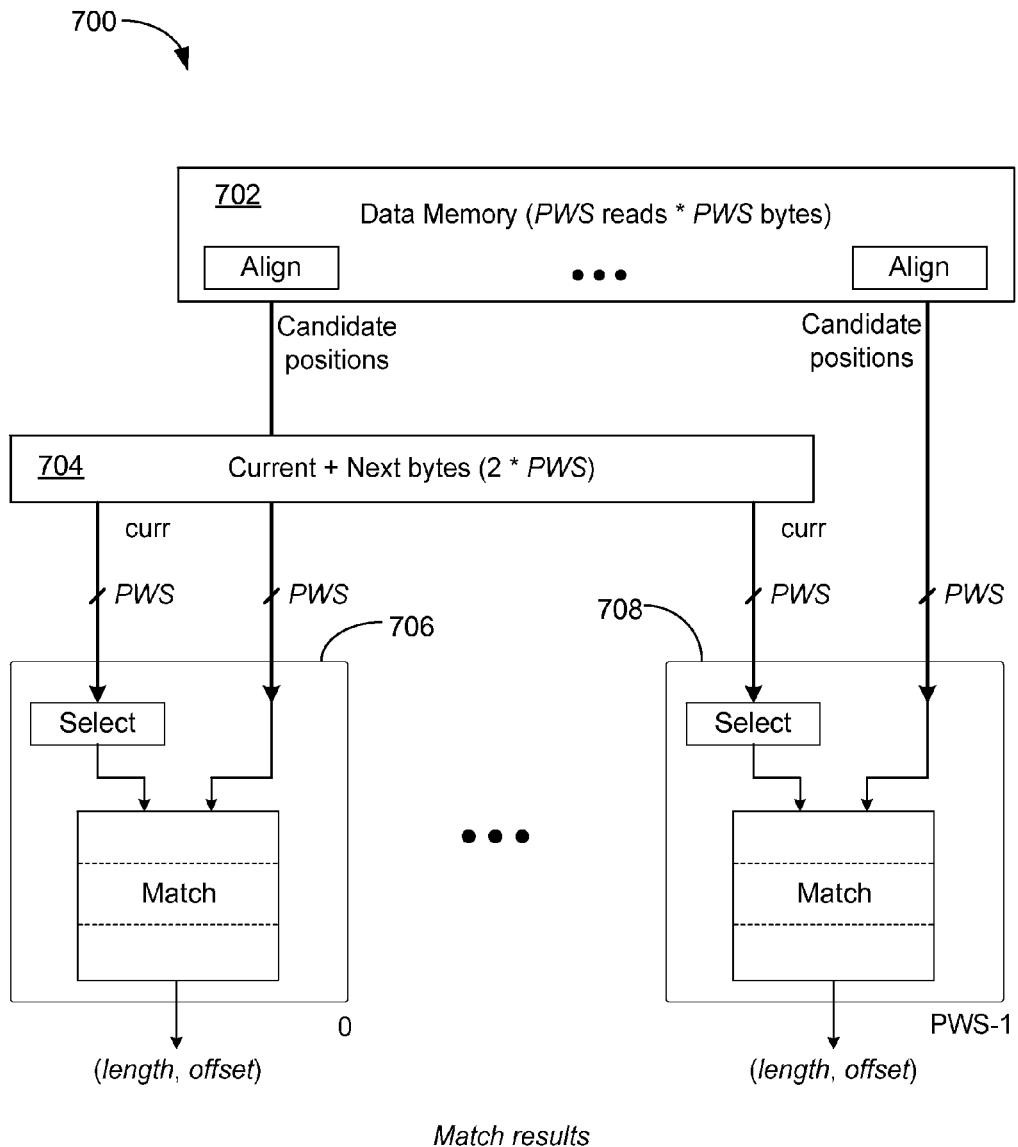
FIG. 7 is a block diagram of an example parallel string matching module for data compression.

FIG. 7 is a block diagram of an example parallel string matching module 700 for data compression. Module 700 may be the same as or similar to string matching module 408 of pipeline system 400.

String matching module 700 may perform PWS parallel matchings between the current string and PWS previous data strings to which those candidate positions refer. For example, the current data string may be stored in pipeline registers, while the previous strings may be fetched from data memory 702 (e.g., which may be the same as or similar to 416 of system 400). For the current data string, string matching module 700 may buffer up to the next window bytes 704 (2*PWS bytes total) so that each position in the current window may have a full PWS byte sequence. In some examples, data memory 702, which stores input bytes, may be configured to prepare vector data for matching. With multiple banks and a data aligner in the banks' data read path, the data aligner may provide PWS consecutive bytes from any input address. The data memory may be replicated by PWS to support parallel matching, providing a total data bandwidth of (PWS*PWS*clock frequency) bytes per second.

Parallel string matching module 700 may include compare modules 706 and 708. With two PWS bytes of data strings available, the compare modules may compare each byte of the two data strings until they become different. As a result, there may be up to PWS matching results, each of which may be represented as a (length, offset) pair.

Figure 8:
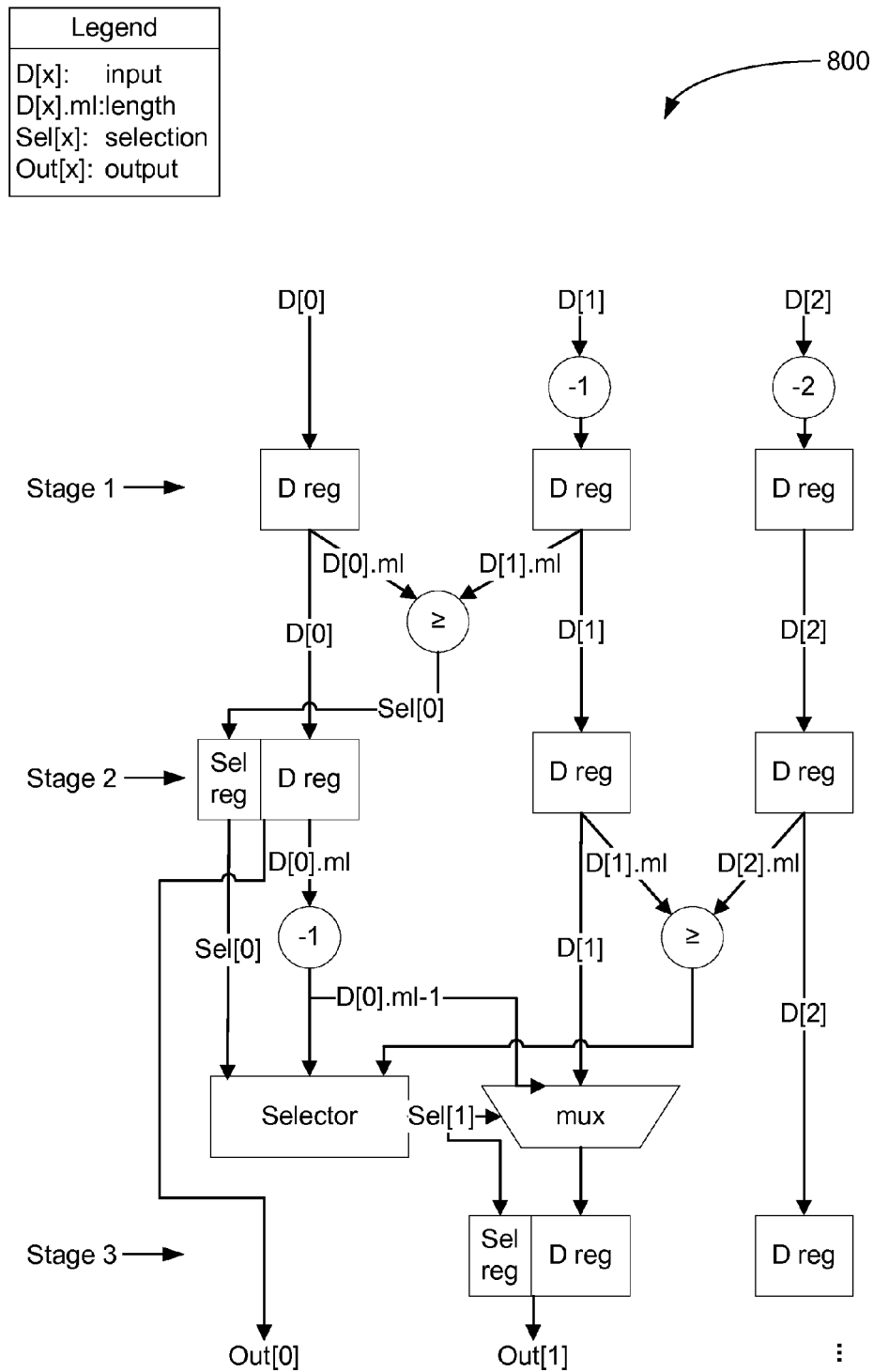
FIG. 8 is a flow diagram of example match selection logic for data compression.

FIG. 8 is a flow diagram of a portion of a process 800 of match selection logic for data compression, for example. In some implementations, process 800 may be performed by match selection module 410 of pipeline system 400. Process 800 may perform, for example, match truncation and selection. Matches identified by string matching may overlap with one another. Match selection module 410 may identify matches to be included in the output stream. Such parallel match selection may involve a challenge in that selecting each match may require knowledge of both past matches and future matches. For example, past matches may preclude selecting a current match. Also, selecting a current match may preclude selecting a better match among future matches. Therefore, a data hazard may exist between adjacent windows if a match in one window may cover positions in the following window. For example, a process of a fully pipelined implementation that examines one position per cycle may involve deciding about a position 1 in window N about (PWS−2) cycles before it decides on position PWS in window N−1.

Process 800 may enable parallel match selection using match truncation. For example, if a potential match would include positions in the following window, then the length of the potential match is reduced such that the new length only covers positions in the current window. In an implementation where each window has PWS positions and the maximum match length is PWS, process 800 may select matches of up to length PWS in the first position, up to (PWS−1) in the second position, up to (PWS−2) in the third position, and so on. Such a match selection technique may sacrifice some compression quality (e.g., about 10-20%), but the technique allows a stall-free and relatively simple pipeline compression process.

The match truncation technique of process 800 may simplify a decision process of whether to select or reject a match based, at least in part, on whether future positions may contain better matches. Since the largest matches may only occur at low-indexed positions, the chances of a better match appearing at a much higher index are relatively low. Process 800, however, could compare each position to its neighbor position that is one index higher. If a neighbor of a particular position contains a longer match (despite the truncation), then process 800 rejects the current position's match and selects a literal instead. Alternatively, if the current position contains an equal or longer match than that of the neighboring position, process 800 selects the match for that position.

Process 800 takes one window of PWS input elements in each cycle from the string match module 408, for example. Each input element may include the literal for that position in the original input and match information, with the match information comprising length, offset, and valid flag. Process 800 may perform match truncation by limiting the match length to the allowable length, as depicted in Stage 1 in FIG. 8. Next, process 800 compares the match lengths of the first two positions at Stage 2. Results of the comparison may determine whether a match or literal is selected for that position.

A process of selecting for positions two and later may account for selections of one or more previous positions. If a previous position is a match that would cover this location, the current position will have no output. Instead, process 800 stores an invalid flag along with one less than the match length of previous positions. As this match length propagates through the pipeline, the match length may be decremented at each stage until the match length reaches zero, which notifies the selector for that stage that a new selection is necessary. In the event that a valid selection can be made at a particular position, the selector may again use a comparison of neighboring match lengths to select the output. This process may continue diagonally through the logic illustrated in FIG. 8, resulting in a (PWS+1) stage unit that outputs the selection for one position per window per cycle.

In an alternate embodiment, the match selection may be performed based, at least in part, upon estimated encoding length or a similar heuristic. In some previous embodiments, a match is selected at a later position if the match matches a longer section of source data, since such a selection tends to result in a shorter encoding. However, if the literal and match encoding lengths are known in advance, such as for static Huffman, or can be estimated, then the actual match lengths may be compared. For example, if a match of length L at position I, or length M at position I+1 are compared, then the preferred match may be chosen based, at least in part, on exact or estimated cost of encoding each match. For a more accurate estimate, the cost of encoding characters that are part of one match but not the other may also be included. For example, if the match at position I+1 is selected, the character at position I is encoded, and thus the cost of the match at position I+1 may include this estimated cost. If M is not equal to L−1, then one match will encode characters beyond the end of the other match. This cost may be estimated by considering the average cost of encoding characters based, at least in part, on general compression results, or through more accurate heuristics.

Figure 9:
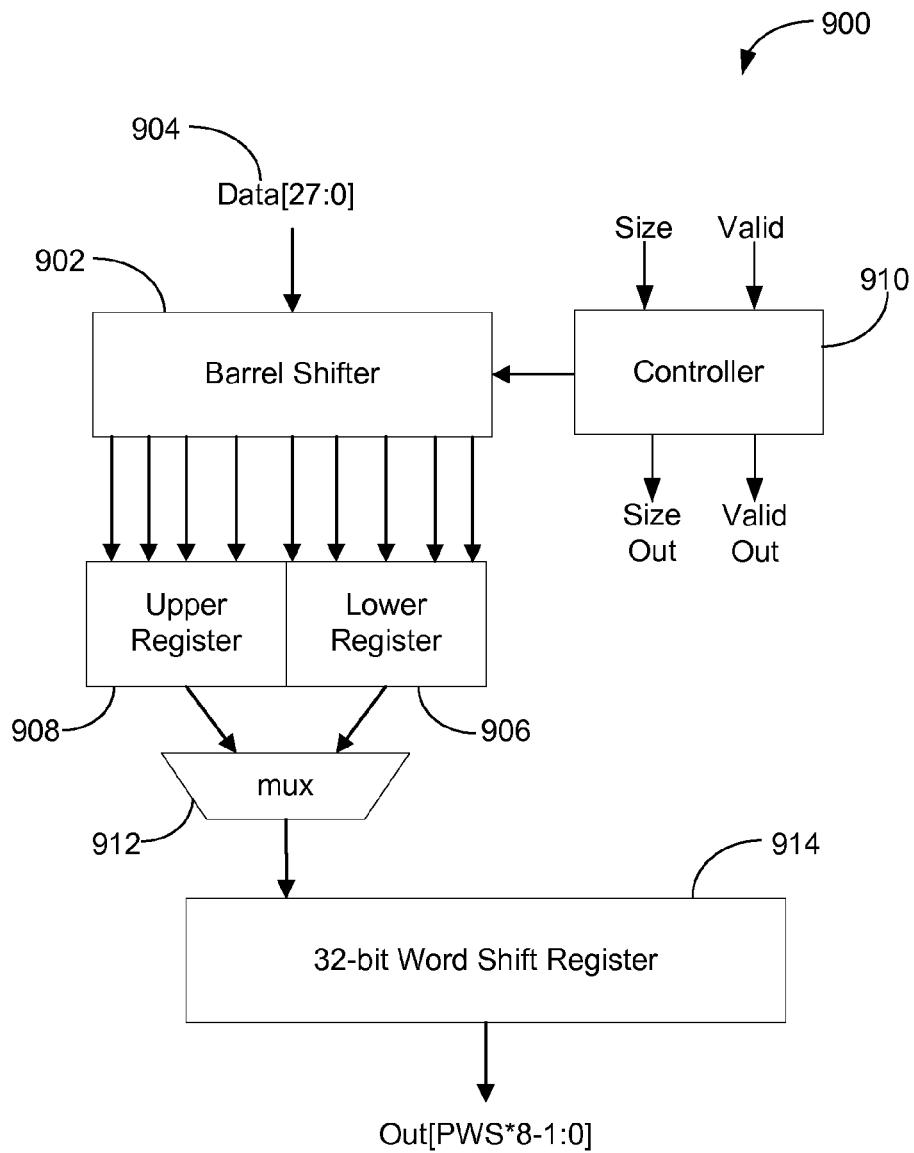
FIG. 9 is a block diagram of an example window bit-packer module for data compression.

FIG. 9 is a block diagram of an example window bit-packer module 900 for data compression. Module 900 may be similar to or the same as bit-packing module 412 of pipeline system 400, for example. Encoding match selection results received from match selection module 700 (e.g., or 410) with static Huffman codes is generally a relatively simple process. A more challenging process, however, is to pack subsequent output data strings into a fixed-width output bit stream. Bit-packer module may include an encoder (e.g., a Huffman encoder) that performs three processes. First, if data is flagged invalid (because it was precluded by a previous match), then it may be ignored. Second, if a literal is selected, the data may be passed through a codebook read-only memory (ROM) and the resulting data and size are passed to other portions of bit-packing module 900. The ROMs may be dual-ported, so in this case (PWS/2) ROMs may be used to allow the encoder to process all selection outputs simultaneously. Finally, if a match is selected, the match length may also be passed to the codebook. The codebook result may then be appended with offset codes and delivered to other portions of bit-packer module 900.

Packing data may be relatively challenging due to the varying throughput of variable-width outputs. The encoded outputs for a single selection may vary from 7 bits to 28 bits, for example, and each window may produce between one and PWS outputs, representing a match of length PWS and PWS literals, respectively. While in some example implementations an encoded match may use up to 28 bits, a minimum match length of four may prevent more than (PWS/4) matches from being selected in a window. Furthermore, in some examples, a match may use as few as 12 bits. Therefore, the total output from one window may occupy between 12 and (PWS*8) bits. In some implementations, a Huffman encoder incorporated in bit-packer module 900 may produce up to one output per window per cycle, and it may take PWS cycles to collect all of the outputs for one window. (There are alternatives, as in some embodiments, to using Huffman encoding. For example, "arithmetic encoding" and "Azure Xpress8 encoding" may be used. Bit packing processes among these processes are similar, although not identical. For example, the Xpress8 encoding produces encoded objects that are 8, 16, 24, or 32 bits, so the logic for bit packing may operate at the byte level instead of the bit level.)

Bit-packing module 900 may operate in two stages. The first stage may include PWS window packers that are each responsible for collecting all of the outputs from one of the PWS parallel windows. During each cycle, one window packer may finish its window and send its data to the second stage, which may be a unified output packer. The output packer may accept compressed windows and may pack the compressed windows into a (PWS*8)-bit output stream.

In some implementations, bit-packing module 900 may include a 64-bit barrel shifter 902 to align incoming data 904 with data that has already been collected from the current window. The aligned values may be logically OR'ed with contents of the lower register 906 of two 32-bit registers 906 and 908 in a double buffer, and then stored back in the register. Bit-packing module 900 may include a controller 910 that tracks the number of bits stored by the above process way. If a buffer is full, contents of the buffer may be transmitted, via a multiplexer 912, to a 32-bit word shift register 914. Next, barrel shifter 902 may continue to fill upper register 908 and use lower register 906 for overflow. Bit-packing module 900 may uses (PWS/4) shift registers, which may allow for bit packing up to 28 bits per cycle, and a total of (PWS*8) bits, using a single 64-bit barrel shifter (which may be pipelined to improve scalability).

An output packer (not illustrated) may be a simpler version of bit-packing module 900, for example. The output packer may accept inputs of up to (PWS*8) bits and may use a (PWS*16) bit barrel shifter to align the bits into a (PWS*16) bit double buffer. If (PWS*8) bits have been collected, the output packer may output these bits and clear that side of the double buffer. This process may be repeated until the entire compressed data stream has been packed (the barrel shifter may be pipelined to improve scalability).

Figure 10:
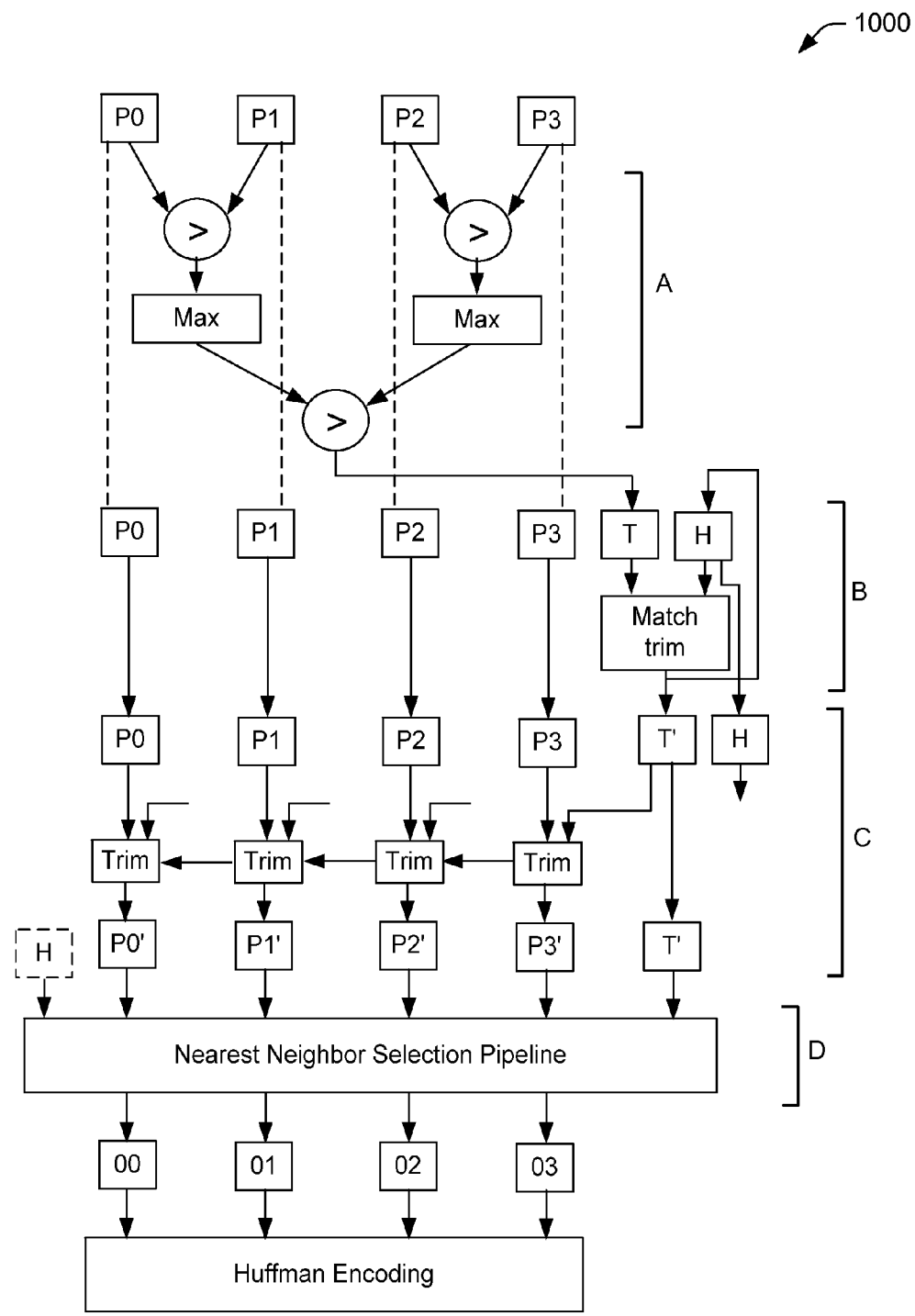
FIG. 10 is a flow diagram of an example data match truncation process.

FIG. 10 is a flow diagram of an alternative data match truncation process 1000 (e.g., "head-tail" process). As described above, a dependency issue in a parallelization window process may occur between neighboring windows of an input data sequence. Match selection results from one window may impact a match selection process for the following window, resulting in a data hazard for window pipelining. To resolve such a problem, matches may be truncated so that the matches only match data within their respective local window.

Process 800, described above, may enable parallel match selection using a match truncation technique. For example, if a potential match would include positions in the following window, the length of the potential match is reduced such that the new length only covers positions in the current window.

Alternative process 1000 computes, for each window J, a preferred match that starts in window J and stretches to data from the subsequent window J+1. The preferred match may be the longest such match, the match that includes the most characters from window J+1, or other heuristic. This preferred match is called a "tail" match for window J. Process 1000 may greedily accept this match (except if there's a conflict, as described below). In some situations, the tail match may be a literal or there may be no tail match for a given window.

In a communication phase A of process 1000, for window J, receive the tail match from window J−1, which is called a "head" match for window J. Process 1000 may allow matches of longer than (PWS*8) bits without the need to increase PWS. Accordingly, if the head match for window J−1 covers all of window J−1, process 1000 will declare it the tail of window J−1 as well, and encode need not occur for this window. If the incoming head match overlaps the pre-computed tail match, process 1000 will prune the tail match accordingly (e.g., if the tail match is at position I of length L, and the head covers positions I and I+1, then a tail match at position I+2 has a length L−2. If this makes the tail match length less than the minimum match length (if any), process 1000 may invalidate the tail match instead. Process 1000 may search for additional tail matches to fall back on, to improve the chances of outputting a valid post-trimming tail match. This search may occur in parallel to determining the first tail match candidate. In some implementations, phase A may be performed in a single pipeline stage of logic. Thus, process 1000 may send the tail match from window J to a communication phase B for window J+1.

In a post-communication trimming phase C of process 1000, any match in a window that extends past the start of the tail match may be trimmed to only extend to the position before the start of the tail match. If the trimming reduces a match length to less than the minimum match length (if any), that match is invalidated.

In a post-communication encoding phase D of process 1000, the head match indicates where in the window encoding begins. The tail match indicates the final match for the window. Because of phase C, none of the matches in the window extend past the tail match. Process 1000 subsequently proceeds with process 800, described above, to find a set of matches to cover everything in between the head match and the tail match. From the end of the head match, process 1000 accepts the match for that position except if the match for the next position is longer.

Figure 11:
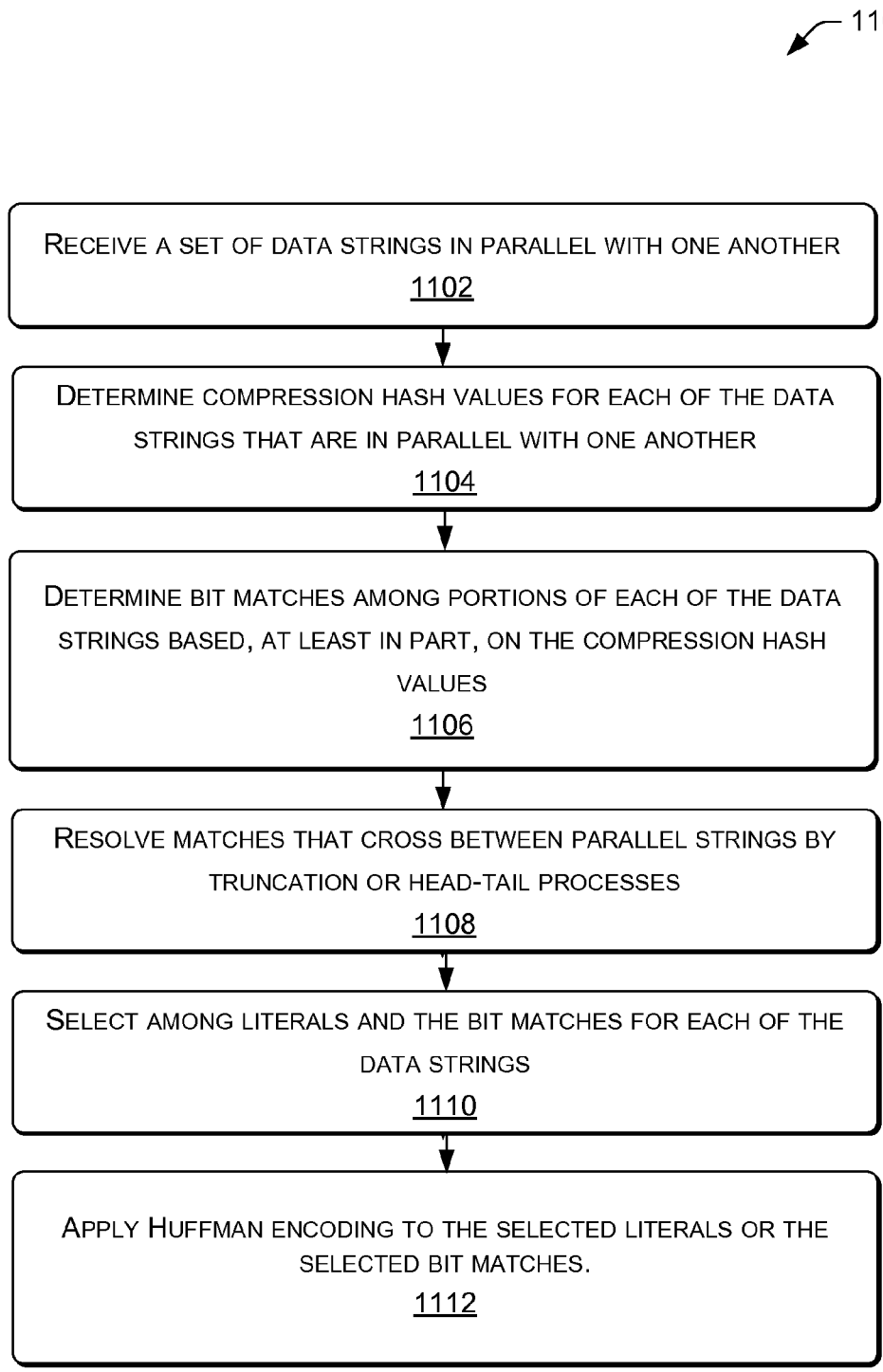
FIG. 11 is a flow diagram of an example data compression process.

FIG. 11 is a flow diagram of a data compression process 1100, which may be performed by pipeline system 400 for data compression, for example. At block 1102 system 400 may receive a set of data strings that are parallel with one another. At block 1104, system 400 may determine compression hash values for each of the data strings. At block 1106, system 400 may determine bit matches among portions of each of the data strings based, at least in part, on the compression hash values. At block 1108, system 400 may resolve matches that cross between the strings by, among others, truncation or head-tail processes. At block 11108, system 400 may select among literals and the bit matches for each of the parallel data strings. At block 1112, system 400 may apply Huffman encoding to the selected literals or the selected bit matches.

Final encoding performed via Huffman encoding (e.g., block 1112) may be performed via a dynamic Huffman encoder that calculates a Huffman tree based, at least in part, on the actual data, static Huffman that uses a pre-computed Huffman tree, or similar approaches to efficiently encode the literal and match data. Such Huffman encoders may have one tree for all data, or separate trees for encoding literals, matches, match lengths, and other elements. Alternatively, numeric values such as match lengths and offsets may be encoded via variable-length numeric encodings. In an alternative embodiment, the final stage of compression may also be performed via Arithmetic Coding, Range Encoding, or similar compression techniques.

EXAMPLE CLAUSES

A. A system comprising: hardware logic circuitry to perform data compression by: generating a multiple hash table that comprises at least a first hash table that includes latest positions for hash indexes and a second hash table that includes second latest positions for hash indices; and reading hash values from the first hash table and the second hash table simultaneously.

B. The system as paragraph A recites, further comprising: a hardware accelerator portion that includes one or more Field-Programmable Gate Arrays (FPGAs).

C. The system as paragraph A recites, wherein: the hash values are requested from the first hash table and the second hash table at a first clock rate; the requested hash values are routed to respective banks; and the respective banks operate at a second clock rate that is different from the first clock rate.

D. The system as paragraph C recites, further comprising an arbiter to discard conflicts among the requested hash values routed to the respective banks E. The system as paragraph C recites, further comprising crossbar switches within the respective banks F. The system as paragraph A recites, wherein: the hash values are read from the first hash table and the second hash table at a first clock rate; the read hash values are routed to respective banks; and the respective banks operate at a second clock rate that is equal to or an integer multiple of the first clock rate and the second clock rate is at least twice the first clock rate.

G. The system as paragraph A recites, wherein generating the multiple hash table is based recites, at least in part, on Lempel-Ziv (LZ77) compression.

H. A computing device comprising: a hardware data compression pipeline accelerator including: a hash calculation module to receive a set of parallel data strings and to determine hash indexes for each of the parallel data strings; a hash table update module to read latest positions for each hash index and update the read latest positions with current string positions; a string match module to determine matches among portions of each of the parallel data strings based, at least in part, on the read latest positions; and a match selection module to select among literals and the matches for each of the parallel data strings.

I. The computing device as paragraph H recites, further comprising a bit-packing module to apply Huffman encoding to the selected literals or the selected matches.

J. The computing device as paragraph H recites, further comprising a bit-packing module to apply arithmetic coding to the selected literals or the selected matches.

K. The computing device as paragraph H recites, wherein the hardware data compression pipeline accelerator comprises one or more Field-Programmable Gate Arrays (FPGAs).

L. The computing device as paragraph H recites, wherein the hardware data compression pipeline accelerator comprises multiple Field-Programmable Gate Arrays (FPGAs) configured in parallel with one another.

M. The computing device as paragraph H recites, wherein the hardware data compression pipeline accelerator is incorporated in a data center and configured to losslessly compress data received by the data center.

N. The computing device as paragraph M recites, wherein the data received by the data center comprises network data traffic via the Internet.

O. The computing device as paragraph M recites, wherein the data is received by the data center at network speeds.

P. A computing device comprising: a memory device to store data; and a hardware data compression pipeline including: a string match module to determine bit matches among positions of each of a set of parallel data strings of the data; and a match selection module to choose among the bit matches that will be used to encode the data.

Q. The computing device as paragraph P recites, wherein the match selection module is configured to process windows of consecutive strings simultaneously.

R. The computing device as paragraph Q recites, wherein the match selection module comprises hardware logic to receive an incoming match from a previous window that overlaps positions in a current window.

S. The computing device as paragraph Q recites, wherein the match selection module comprises hardware logic to truncate matches within a particular window based, at least in part, on the incoming match from the previous window.

T. The computing device as paragraph Q recites, wherein the match selection module comprises hardware logic to complete the match selection process only after receiving the incoming match from the previous window.

Although the techniques have been described in language specific to structural features and/or methodological acts, it is to be understood that the appended claims are not necessarily limited to the features or acts described. Rather, the features and acts are described as example implementations of such techniques.

Unless otherwise noted, all of the methods and processes described above may be embodied in whole or in part by software code modules executed by one or more general purpose computers or processors. The code modules may be stored in any type of computer-readable storage medium or other computer storage device. Some or all of the methods may alternatively be implemented in whole or in part by specialized computer hardware, such as FPGAs, ASICs, etc.

Conditional language such as, among others, "can," "could," "might" or "may," unless specifically stated otherwise, are used to indicate that certain examples include, while other examples do not include, the noted features, elements and/or steps. Thus, unless otherwise stated, such conditional language is not intended to imply that features, elements and/or steps are in any way required for one or more examples or that one or more examples necessarily include logic for deciding, with or without user input or prompting, whether these features, elements and/or steps are included or are to be performed in any particular example.

Conjunctive language such as the phrase "at least one of X, Y or Z," unless specifically stated otherwise, is to be understood to present that an item, term, etc. may be either X, or Y, or Z, or a combination thereof Many variations and modifications may be made to the above-described examples, the elements of which are to be understood as being among other acceptable examples. All such modifications and variations are intended to be included herein within the scope of this disclosure.

What is claimed is:

1. A system comprising:
   hardware logic circuitry to perform data compression by:
   generating a multiple hash table that comprises at least a first hash table that includes latest positions for hash indexes and a second hash table that includes second latest positions for hash indices;
   reading hash values from the first hash table and the second hash table simultaneously at a first clock rate; and
   routing the read hash values to respective banks that operate at a second clock rate that is different from the first clock rate.

2. The system of claim 1, further comprising:
   a hardware accelerator portion that includes one or more Field-Programmable Gate Arrays (FPGAs).

3. The system of claim 1, further comprising an arbiter to discard conflicts among the requested hash values routed to the respective banks.

4. The system of claim 1, further comprising crossbar switches within the respective banks.

5. The system of claim 1, wherein
   the second clock rate is an integer multiple of the first clock rate.

6. The system of claim 1, wherein generating the multiple hash table is based, at least in part, on Lempel-Ziv (LZ77) compression.

7. The system of claim 1, wherein the second clock rate is at least twice the first clock rate.

8. A computing device comprising:
   a hardware data compression pipeline accelerator including:
   a hash calculation module to receive a set of parallel data strings and to determine hash indexes for each of the parallel data strings;
   a hash table update module to read latest positions for each hash index and update the read latest positions with current string positions;
   a string match module to determine matches among portions of each of the parallel data strings based, at least in part, on the read latest positions; and
   a match selection module to select among literals and the matches for each of the parallel data strings.

9. The computing device of claim 8, further comprising a bit-packing module to apply Huffman encoding to the selected literals or the selected matches.

10. The computing device of claim 8, further comprising a bit-packing module to apply arithmetic coding to the selected literals or the selected matches.

11. The computing device of claim 8, wherein the hardware data compression pipeline accelerator comprises one or more Field-Programmable Gate Arrays (FPGAs).

12. The computing device of claim 8, wherein the hardware data compression pipeline accelerator comprises multiple Field-Programmable Gate Arrays (FPGAs) configured in parallel with one another.

13. The computing device of claim 8, wherein the hardware data compression pipeline accelerator is incorporated in a data center and configured to losslessly compress data received by the data center.

14. The computing device of claim 13, wherein the data received by the data center comprises network data traffic via the Internet.

15. The computing device of claim 13, wherein the data is received by the data center at network speeds.

16. A computing device comprising:
   a memory device to store data; and
   a hardware data compression pipeline including:
   a string match module to determine bit matches among positions of each of a set of parallel data strings of the data; and
   a match selection module to choose among the bit matches that will be used to encode the data.

17. The computing device of claim 16, wherein the match selection module is configured to process windows of consecutive strings simultaneously.

18. The computing device of claim 17, wherein the match selection module comprises hardware logic to receive an incoming match from a previous window that overlaps positions in a current window.

19. The computing device of claim 17, wherein the match selection module comprises hardware logic to truncate matches within a particular window based, at least in part, on the incoming match from the previous window.

20. The computing device of claim 17, wherein the match selection module comprises hardware logic to complete the match selection process only after receiving the incoming match from the previous window.

* * * * *